United States Patent
Kitazume

(10) Patent No.: US 12,388,408 B2
(45) Date of Patent: Aug. 12, 2025

(54) FILTER AND MULTIPLEXER

(71) Applicant: TAIYO YUDEN CO., LTD., Tokyo (JP)

(72) Inventor: Hidenori Kitazume, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 253 days.

(21) Appl. No.: 18/182,579

(22) Filed: Mar. 13, 2023

(65) Prior Publication Data
US 2023/0327632 A1    Oct. 12, 2023

(30) Foreign Application Priority Data

Mar. 17, 2022    (JP) ................. 2022-043148

(51) Int. Cl.
| | |
|---|---|
| H03H 7/01 | (2006.01) |
| H01F 27/28 | (2006.01) |
| H01G 4/30 | (2006.01) |
| H03H 1/00 | (2006.01) |
| H03H 7/46 | (2006.01) |

(52) U.S. Cl.
CPC ....... H03H 7/0115 (2013.01); H01F 27/2804 (2013.01); H01G 4/30 (2013.01); *H03H 2001/0085* (2013.01); *H03H 7/46* (2013.01)

(58) Field of Classification Search
CPC .............. H03H 2001/0085; H03H 7/0115
USPC ................................................. 333/175, 185
See application file for complete search history.

(56) References Cited

U.S. PATENT DOCUMENTS

| | | | |
|---|---|---|---|
| 2006/0145782 A1* | 7/2006 | Liu ................. | H03H 7/463 333/132 |
| 2015/0318593 A1* | 11/2015 | Imamura .............. | H03H 7/1775 333/175 |
| 2018/0034436 A1 | 2/2018 | Masuda et al. | |

FOREIGN PATENT DOCUMENTS

| | | |
|---|---|---|
| JP | 2013-219469 A | 10/2013 |
| JP | 2018-19316 A | 2/2018 |

* cited by examiner

*Primary Examiner* — Rakesh B Patel
(74) *Attorney, Agent, or Firm* — CHEN YOSHIMURA LLP

(57) ABSTRACT

A filter includes a multilayer body including dielectric layers and conductor layers, input and output terminals provided on a surface of the multilayer body, a first conductor pattern that has a planar shape forming at least a part of a closed pattern having an opening, a second conductor pattern that is connected to the input terminal, at least partially overlaps at least a part of the first conductor pattern, has an end portion located within the opening, and extends from an inside of the opening to an outside of the closed pattern, and a third conductor pattern that is connected to the output terminal, at least partially overlaps at least a part of the first conductor pattern, does not overlap the second conductor pattern, has an end portion located within the opening, and extends from the inside of the opening to the outside of the closed pattern.

12 Claims, 12 Drawing Sheets

FILTER AND MULTIPLEXER

FIELD

A certain aspect of the present disclosure relates to a filter and a multiplexer.

BACKGROUND

In mobile terminals such as notebook personal computers, smartphones, tablet terminals, or mobile phones, a filter that allows only high-frequency signals in a certain frequency band to pass therethrough is used. A multilayer filter in which dielectric layers are stacked is known as a filter, as disclosed in, for example, Japanese Patent Application Laid-Open Nos. 2013-219469 and 2018-19316 (Patent Documents 1 and 2).

RELATED ART DOCUMENTS

Patent Documents

Japanese Patent Application Laid-Open No. 2013-219469
Japanese Patent Application Laid-Open No. 2018-19316

SUMMARY

In a filter for filtering high-frequency signals, it is required to reduce spurious emissions. An object of the present disclosure is to reduce spurious emissions.

In one aspect of the present disclosure, there is provided a filter including: a multilayer body in which a plurality of dielectric layers and a plurality of conductor layers are alternately stacked in a stacking direction; an input terminal provided on a surface of the multilayer body; an output terminal provided on a surface of the multilayer body; a first conductor pattern formed of a first conductor layer of the plurality of conductor layers, the first conductor pattern having a planar shape that forms at least a part of a closed pattern having an opening when viewed from the stacking direction; a second conductor pattern formed of a second conductor layer different from the first conductor layer of the plurality of conductor layers, and connected to the input terminal, at least a part of the second conductor pattern overlapping with at least a part of the first conductor pattern when viewed from the stacking direction, an end portion of the second conductor pattern being located within the opening of the closed pattern when viewed from the stacking direction, the second conductor pattern extending from an inside of the opening to an outside of the closed pattern when viewed from the stacking direction; and a third conductor pattern formed of a third conductor layer that is same as or different from the second conductor layer and that is different from the first conductor layer of the plurality of conductor layers, and connected to the output terminal, at least a part of the third conductor pattern overlapping with at least a part of the first conductor pattern when viewed from the stacking direction, the third conductor pattern not overlapping with the second conductor pattern when viewed from the stacking direction, an end portion of the third conductor pattern being located within the opening of the closed pattern when viewed from the stacking direction, the third conductor pattern extending from the inside of the opening to the outside of the closed pattern when viewed from the stacking direction.

In the above filter, the closed pattern may be a pattern in which a path through which a current flows is closed.

In the above filter, the second conductor pattern and the third conductor pattern may be provided so as to face each other across the opening when viewed from the stacking direction.

In the above filter, a planar shape of a region where the first conductor pattern and the second conductor pattern overlap each other may be a substantially parallelogram when viewed from the stacking direction, and a planar shape of a region where the first conductor pattern and the third conductor pattern overlap each other may be a substantially parallelogram when viewed from the stacking direction.

In the above filter, the first conductor pattern and the second conductor pattern may form a first capacitor, and the first conductor pattern and the third conductor pattern may form a second capacitor.

The above filter may further include: a first inductor connected in parallel to the first capacitor between the input terminal and the output terminal; and a second inductor connected in parallel to the second capacitor between the input terminal and the output terminal.

In the above filter, a first parallel resonant circuit including the first capacitor and the first inductor may form an attenuation pole at a frequency higher than a passband, and a second parallel resonant circuit including the second capacitor and the second inductor may form an attenuation pole at a frequency higher than the passband.

The above filter may further include: a ground terminal provided on a surface of the multilayer body; and a third capacitor having a first end connected to the first conductor pattern and a second end connected to the ground terminal.

In the above filter, a first width, along the opening, of a region where the second conductor pattern overlaps the first conductor pattern when viewed from the stacking direction may be smaller than a width, in a width direction of the first width, of the opening, and a second width, along the opening, of a region where the third conductor pattern overlaps the first conductor pattern when viewed from the stacking direction may be smaller than a width, in a width direction of the second width, of the opening.

In the above filter, $X \leq 1.875 \times 10^7/(fc \times \sqrt{\varepsilon r})$ may be satisfied where $X$ (m) is a maximum width of the closed pattern, fc (Hz) is a high frequency end of a passband, and $\varepsilon r$ is a relative permittivity of each of the plurality of dielectric layers.

In the above filter, the closed pattern may be formed of the first conductive layer.

In the above filter, the closed pattern may include: the first conductor pattern, a fourth conductor pattern formed of a fourth conductor layer different from the first conductor layer of the plurality of conductor layers, and a via wiring that penetrates through one or some dielectric layers of the plurality of dielectric layers and connects the first conductor pattern and the fourth conductor pattern.

In the above filter, the filter may be a low-pass filter or a band-pass filter.

In another aspect of the present disclosure, there is provided a multiplexer including the above filter.

DETAILED DESCRIPTION

Hereinafter, embodiments of the present disclosure will be described with reference to the drawings.

FIRST EMBODIMENT

As a first embodiment, a low-pass filter (LPF) used in a 5th generation (5G) mobile communication system will be described as an example.

In the 5G communication system, millimeter waves in the 28 GHz band or the like are used, and even a filter having a passband of 6 GHz or less is required to have improved attenuation characteristics in the frequency band from the passband to around 30 GHz.

Figure 1:
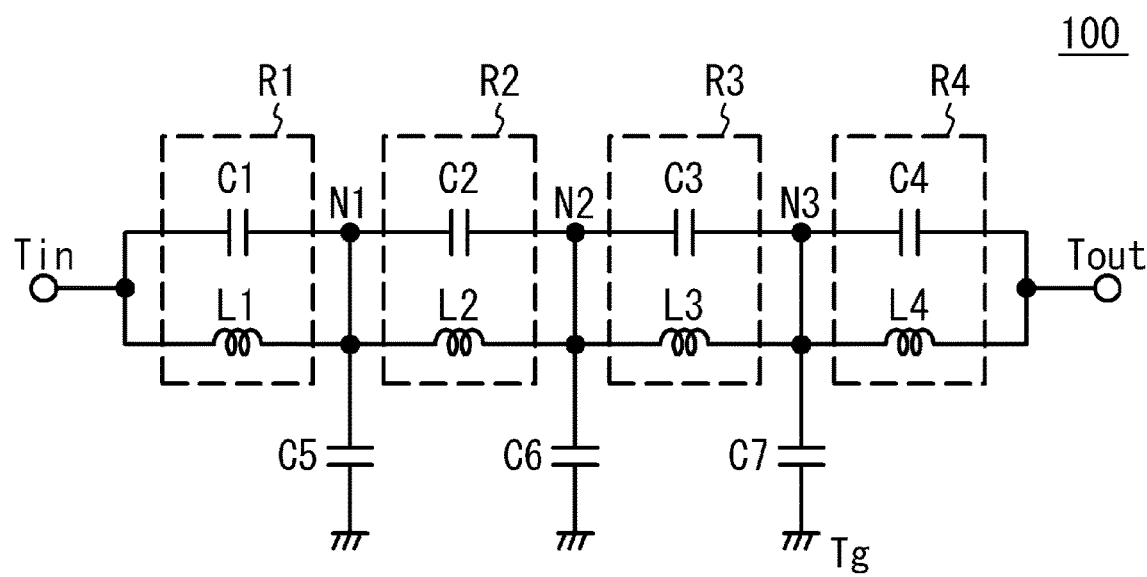
FIG. 1 is a circuit diagram of a filter in accordance with a first embodiment.

FIG. 1 is a circuit diagram of a filter in accordance with the first embodiment. As illustrated in FIG. 1, a filter 100 of the first embodiment includes an input terminal Tin, an output terminal Tout, a ground terminal Tg, capacitors C1 to C7, and inductors L1 to L4. Parallel resonant circuits R1 to R4 are connected in series between the input terminal Tin and the output terminal Tout. A node between the parallel resonant circuits R1 and R2 is a node N1, a node between the parallel resonant circuits R2 and R3 is a node N2, and a node between the parallel resonant circuits R3 and R4 is a node N3. In the parallel resonant circuits R1 to R4, the capacitors C1 to C4 and the inductors L1 to L4 are connected in parallel, respectively. The capacitors C5 to C7 are connected between the nodes N1 to N3 and the ground terminal Tg, respectively.

Figure 2A:
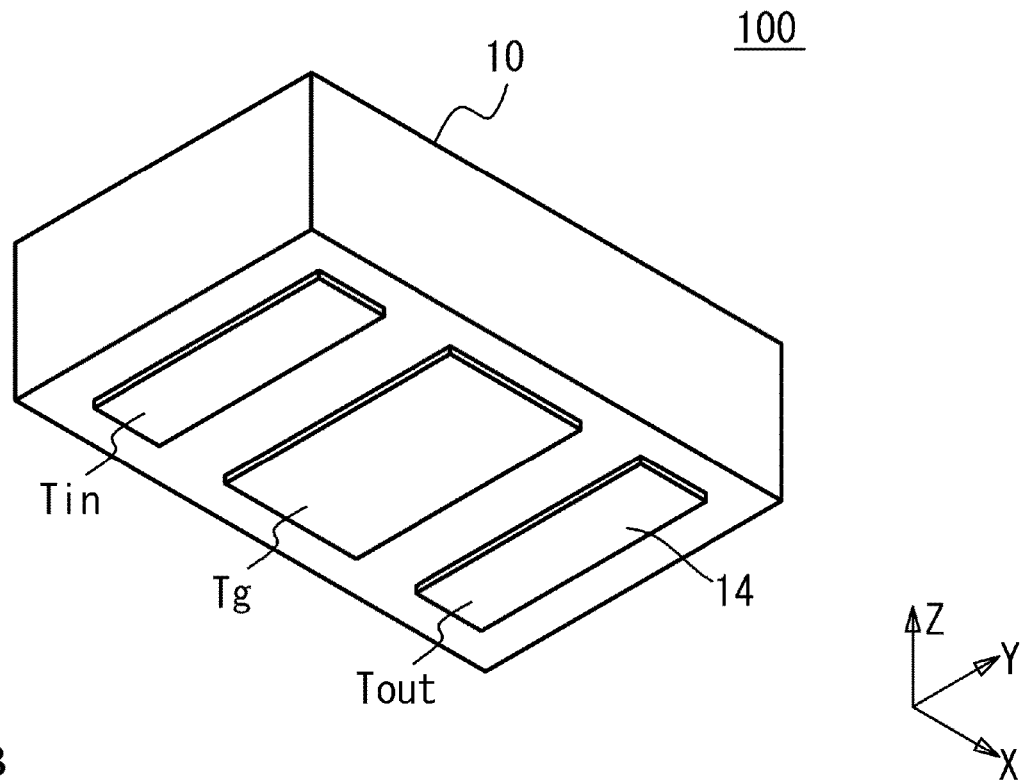
FIG. 2A and FIG. 2B are a perspective view and a cross-sectional view of the filter in accordance with the first embodiment, respectively.
Figure 2B:
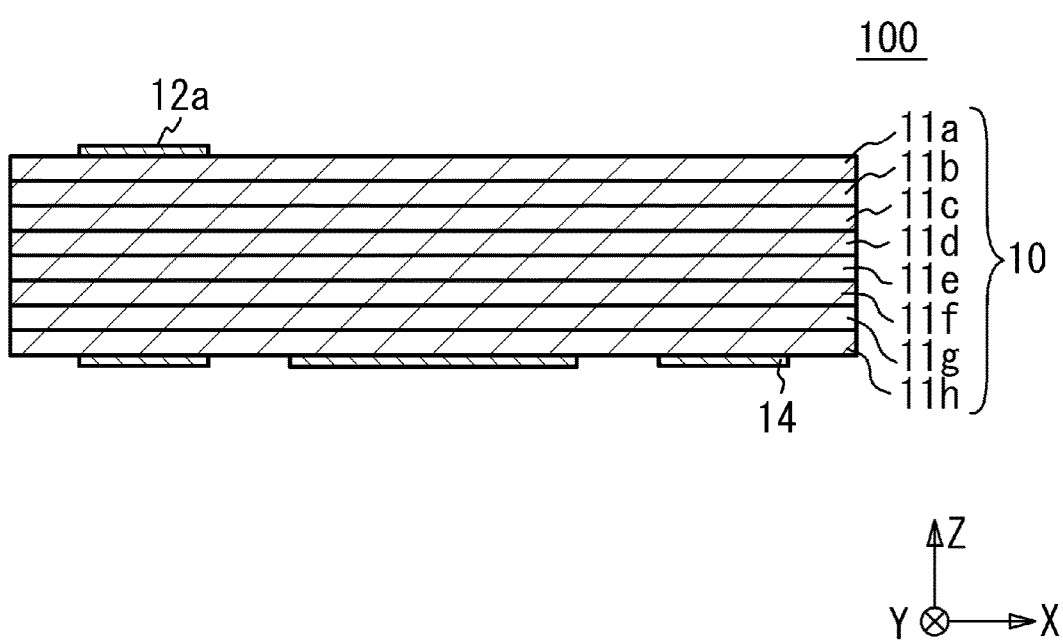

FIG. 2A and FIG. 2B are a perspective view and a cross-sectional view of the filter in accordance with the first embodiment, respectively. A stacking direction of dielectric layers 11a to 11h is defined as a Z direction, an arrangement direction of terminals 14 in planar directions of the dielectric layers 11a to 11h is defined as an X direction, and a direction orthogonal to the X direction is defined as a Y direction. As illustrated in FIG. 2A and FIG. 2B, the filter 100 includes a multilayer body 10. The multilayer body 10 includes a plurality of the dielectric layers 11a to 11h that are stacked. The terminals 14 are provided on the lower surface of the multilayer body 10. The terminals 14 are, for example, the input terminal Tin, the output terminal Tout, and the ground terminal Tg. On the upper surface of the multilayer body 10, a direction identification mark is provided by a conductor layer 12a.

Figure 3A:
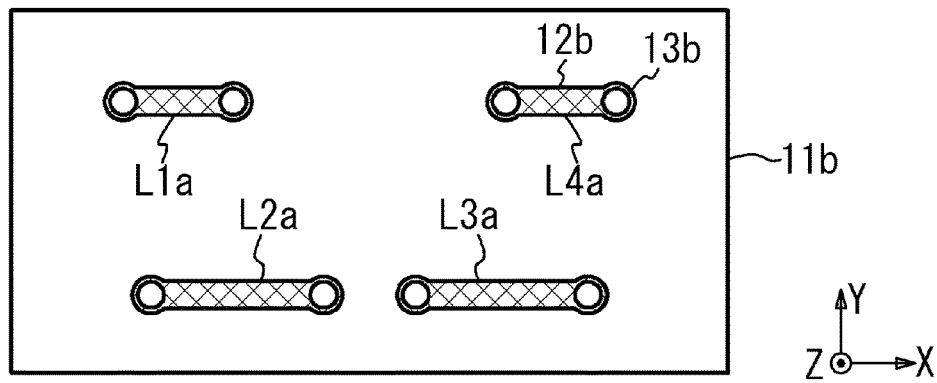
FIG. 3A to FIG. 3D are plan views of dielectric layers in the first embodiment.
Figure 3B:
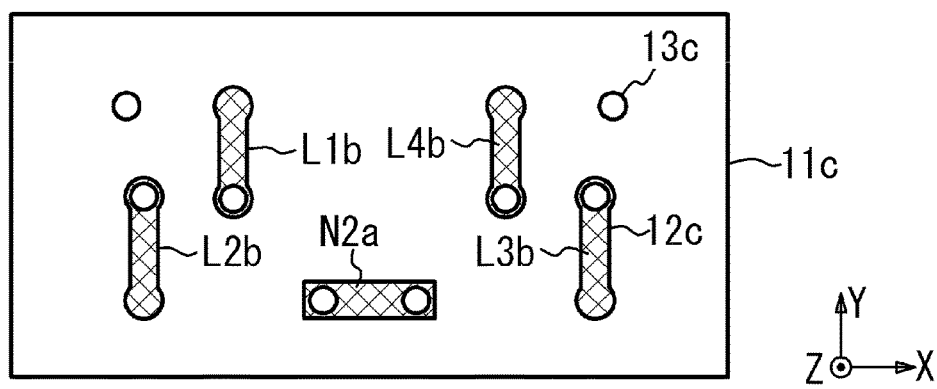
Figure 3C:
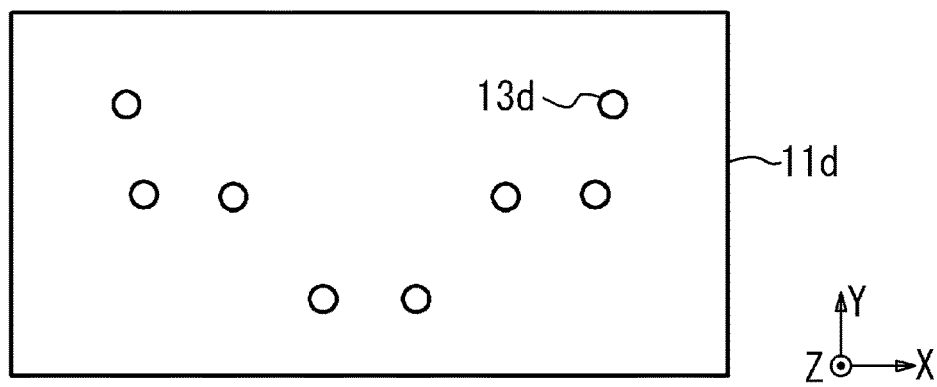
Figure 3D:
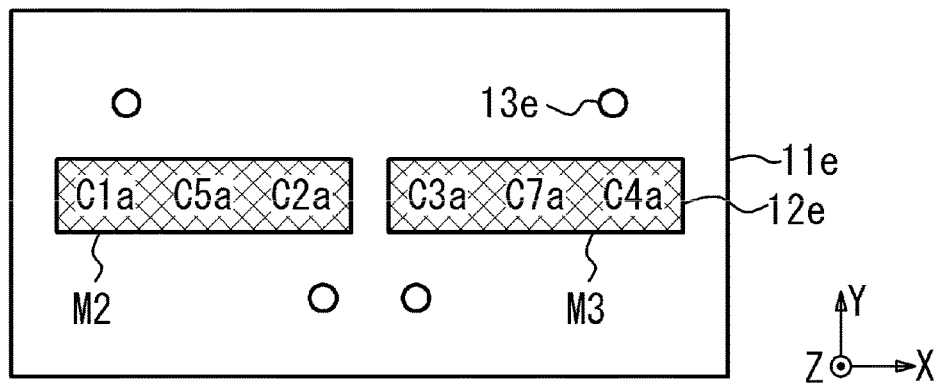
Figure 4A:
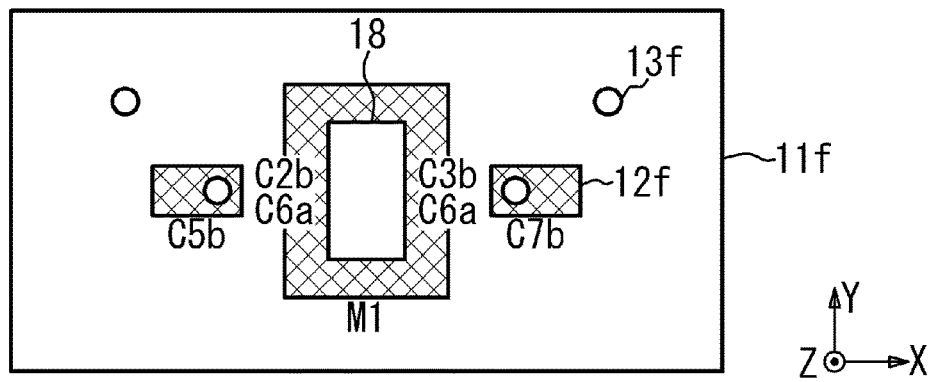
FIG. 4A to FIG. 4D are plan views of the dielectric layers in the first embodiment.
Figure 4B:
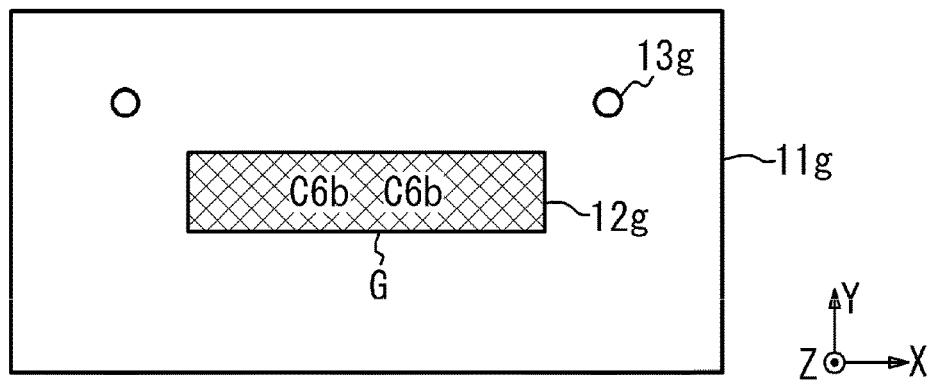
Figure 4C:
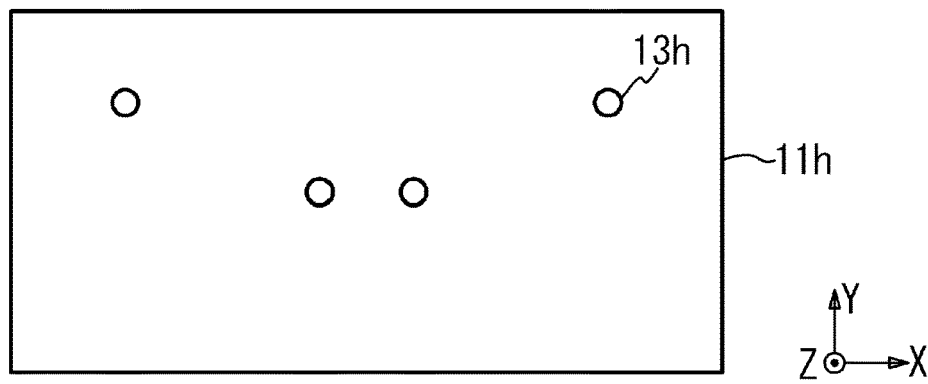
Figure 4D:
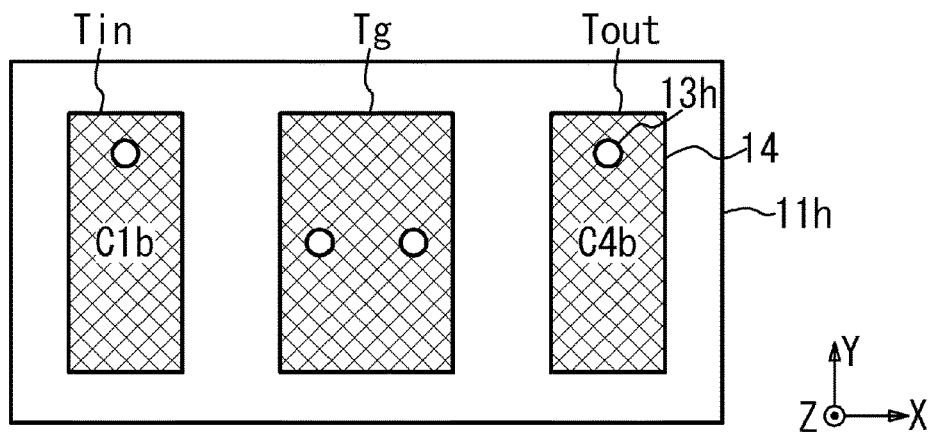

FIG. 3A to FIG. 4D are plan views of the dielectric layers in the first embodiment. FIG. 3A to FIG. 4C illustrate conductor layers on the upper surfaces of the dielectric layers 11b to 11h and via wirings 13b to 13h penetrating through the dielectric layers 11b to 11h, respectively. FIG. 4D illustrates the terminals 14 and the via wirings 13h on the lower surface of the dielectric layer 11h as transparently viewed through the dielectric layer 11h from above. An electrode C1a in a conductor pattern M2 in FIG. 3D and an electrode C1b in the input terminal Tin in FIG. 4D indicate that the electrodes C1a and C1b form a capacitor C1 by sandwiching the dielectric layers 11e to 11h therebetween. The same applies to electrodes C2a to C7a and C2b to C7b in FIG. 3D to FIG. 4B and FIG. 4D. The same applies to the following similar drawings.

As illustrated in FIG. 3A, a conductor layer 12b forming line patterns L1a to L4a is provided on the upper surface of the dielectric layer 11b. As illustrated in FIG. 3B, a conductor layer 12c forming line patterns L1b to L4b and a conductor pattern N2a is provided on the upper surface of the dielectric layer 11c. The via wirings 13c penetrating through the dielectric layer 11c are provided.

As illustrated in FIG. 3C, no conductor layer is formed on the upper surface of the dielectric layer 11d. The via wirings 13d penetrating through the dielectric layer 11d are provided. As illustrated in FIG. 3D, on the upper surface of the dielectric layer 11e, the conductor layer 12e forming conductor patterns M2 and M3 is provided. The via wirings 13e penetrating through the dielectric layer 11e are provided. The conductor pattern M2 includes the electrodes C1a, C2a, and C5a, and corresponds to the node N1. The conductor pattern M3 includes the electrodes C3a, C4a, and C7a, and corresponds to the node N3.

As illustrated in FIG. 4A, a conductor layer 12f forming a conductor pattern M1 and the electrodes C5b and C7b is provided on the upper surface of the dielectric layer 11f. The via wirings 13f penetrating through the dielectric layer 11f are provided. The conductor pattern M1 includes the electrodes C2b, C3b, and C6a. The conductor patterns M1 and N2a are electrically connected to each other through the via wirings 13c to 13e, and correspond to the node N2.

As illustrated in FIG. 4B, a conductor layer 12g forming a conductor pattern G is provided on the upper surface of the dielectric layer 11g. The via wirings 13g penetrating through the dielectric layer 11g are provided. The conductor pattern G is a ground pattern electrically connected to the ground terminal Tg through the via wirings 13g and 13h, and includes the electrode C6b. The conductor pattern G is electrically connected to the electrodes C5b and C7b of FIG. 4A through the via wirings 13f.

As illustrated in FIG. 4C, no conductor pattern is formed on the upper surface of the dielectric layer 11h. The via wirings 13h penetrating through the dielectric layer 11h is provided. As illustrated in FIG. 4D, the terminals 14 are formed on the lower surface of the dielectric layer 11h. The terminals 14 include the input terminal Tin, the output terminal Tout, and the ground terminal Tg. The input terminal Tin includes the electrode C1b, and the output terminal Tout includes the electrode C4b.

The inductor L1 is formed of the line patterns L1a and L1b and the via wirings 13b to 13h, and is connected between the input terminal Tin and the conductor pattern M2 corresponding to the node N1. The inductor L2 is formed of the line patterns L2a and L2b and the via wirings 13b to 13d, and is connected between the conductor pattern M2 corresponding to the node N1 and the conductor pattern N2a corresponding to the node N2. The inductor L3 is formed of the line patterns L3a and L3b and the via wirings 13b to 13d, and is connected between the conductor pattern N2a corresponding to the node N2 and the conductor pattern M3 corresponding to the node N3. The inductor L4 is formed of the line patterns L4a and L4b and the via wirings 13b to 13h, and is connected between the conductor pattern M3 corresponding to the node N3 and the output terminal Tout.

The capacitor C1 is formed of the electrodes C1a and C1b sandwiching the dielectric layers 11e to 11h therebetween, and is connected between the input node Tin and the conductor pattern M2 corresponding to the node N1. The capacitor C2 is formed of the electrodes C2a and C2b sandwiching the dielectric layer 11e therebetween, and is connected between the conductor pattern M2 corresponding to the node N1 and the conductor pattern M1 corresponding to the node N2. The capacitor C3 is formed of the electrodes C3a and C3b sandwiching the dielectric layer 11e therebetween, and is connected between the conductor pattern M1 corresponding to the node N2 and the conductor pattern M3 corresponding to the node N3. The capacitor C4 is formed of the electrodes C4a and C4b sandwiching the dielectric layers 11e to 11h therebetween, and is connected between the conductor pattern M3 corresponding to the node N3 and the output terminal Tout.

The capacitor C5 is formed of the electrodes C5a and C5b sandwiching the dielectric layer 11e therebetween, and is connected between the conductor pattern M2 corresponding to the node N1 and the ground terminal Tg. The capacitor C6 is formed of the electrodes C6a and C6b sandwiching the dielectric layer 11f therebetween, and is connected between the conductor pattern M1 corresponding to the node N2 and the ground terminal Tg. The capacitor C7 is formed of the electrodes C7a and C7b sandwiching the dielectric layer 11e therebetween, and is connected between the conductor pattern M3 corresponding to the node N3 and the ground terminal Tg.

The dielectric layers 11a to 11h are made of a ceramic material and contain, for example, an oxide of Si, Ca, and Mg (for example, $CaMgSi_2O_6$, which is a diopside crystal) as a main component. The main components of the dielectric layers 11a to 11h may be oxides other than oxides of Si, Ca and/or Mg. Furthermore, the dielectric layers 11a to 11h may contain at least one of oxides of Ti, Zr, and Al as an insulating material.

The conductor layers 12a to 12c and 12e to 12g, the via wirings 13b to 13h, and the upper portions of the terminals 14 are metal layers containing, for example, Ag, Pd, Pt, Cu, Ni, Au, Au—Pd alloys, or Ag—Pt alloys as a main component. The upper portion of the terminal 14 may contain a non-conductive material such as $TiO_2$, $ZrO_2$, or $Al_2O_3$ in addition to the above metal material. The lower portion of the terminal 14 is a Ni film and a Sn film.

In the first embodiment, as illustrated in FIG. 4A, the planar shape of the conductor pattern M1 is a quadrangular shape, and the conductor pattern M1 has an opening 18 having a quadrangular planar shape. Thus, the conductor pattern M1 is a closed pattern in which a path through which a current flows is closed.

COMPARATIVE EXAMPLES

Figure 5A:
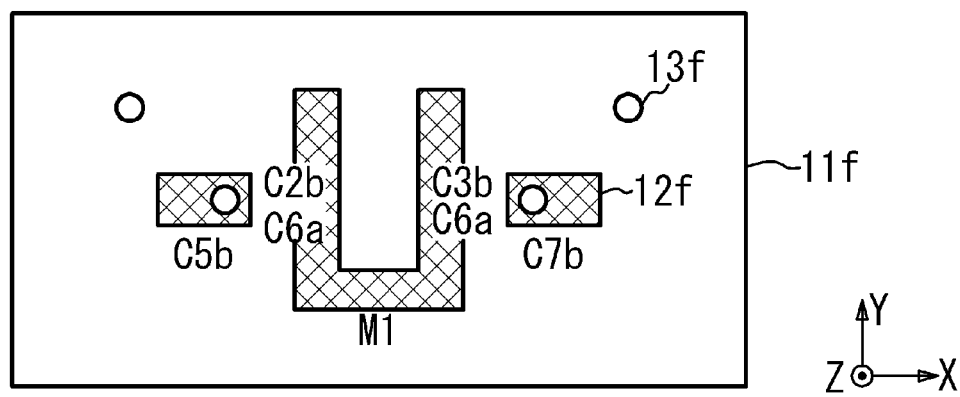
FIG. 5A and FIG. 5B are plan views of dielectric layers in first and second comparative examples, respectively.
Figure 5B:
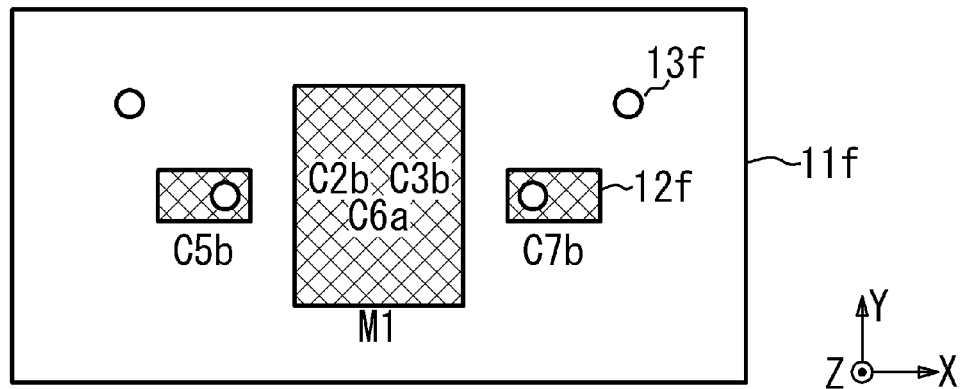

FIG. 5A and FIG. 5B are plan views of dielectric layers in first and second comparative examples, respectively. As illustrated in FIG. 5A, in the first comparative example, the planar shape of the conductor pattern M1 on the upper surface of the dielectric layer 11f is a U shape obtained by removing one side from the sides of a quadrangular shape, and is not a closed pattern. As illustrated in FIG. 5B, in the second comparative example, the planar shape of the conductor pattern M1 in the dielectric layer 11f is a solid quadrangular shape without an opening. The upper surfaces of other dielectric layers 11b to 11e, 11g, and 11h and the lower surface of the dielectric layer 11h in the first and second comparative examples have the same configurations as those in FIG. 3A to FIG. 3D and FIG. 4B to FIG. 4D, respectively.

Simulation

Three-dimensional electromagnetic field simulation was performed on the first embodiment and the first and second comparative examples using a finite element method to simulate the pass characteristics and reflection characteristics of the filter.

Each of the dielectric layers 11a to 11h contains $CaMgSi_2O_6$ as a main component and has a relative permittivity of about 10. Since the frequencies supported by the filter 100 are as high as 1 GHz to 40 GHz, the filter 100 functions like a distributed constant circuit. Therefore, although the capacitances of the capacitors C1 to C7 and the inductances of the inductors L1 to L4 are not determined, approximate values of the capacitances of the capacitors C1 to C7 and the inductances of the inductors L1 to L4 in the first embodiment and the first and second comparative examples are presented in Table 1.

TABLE 1

| Capacitance [pF] | | | | | | | Inductance [nH] | | | |
|---|---|---|---|---|---|---|---|---|---|---|
| C1 | C2 | C3 | C4 | C5 | C6 | C7 | L1 | L2 | L3 | L4 |
| 0.1 | 1.4 | 1.4 | 0.1 | 0.45 | 0.35 | 0.45 | 0.8 | 0.4 | 0.4 | 0.8 |

Figure 6:
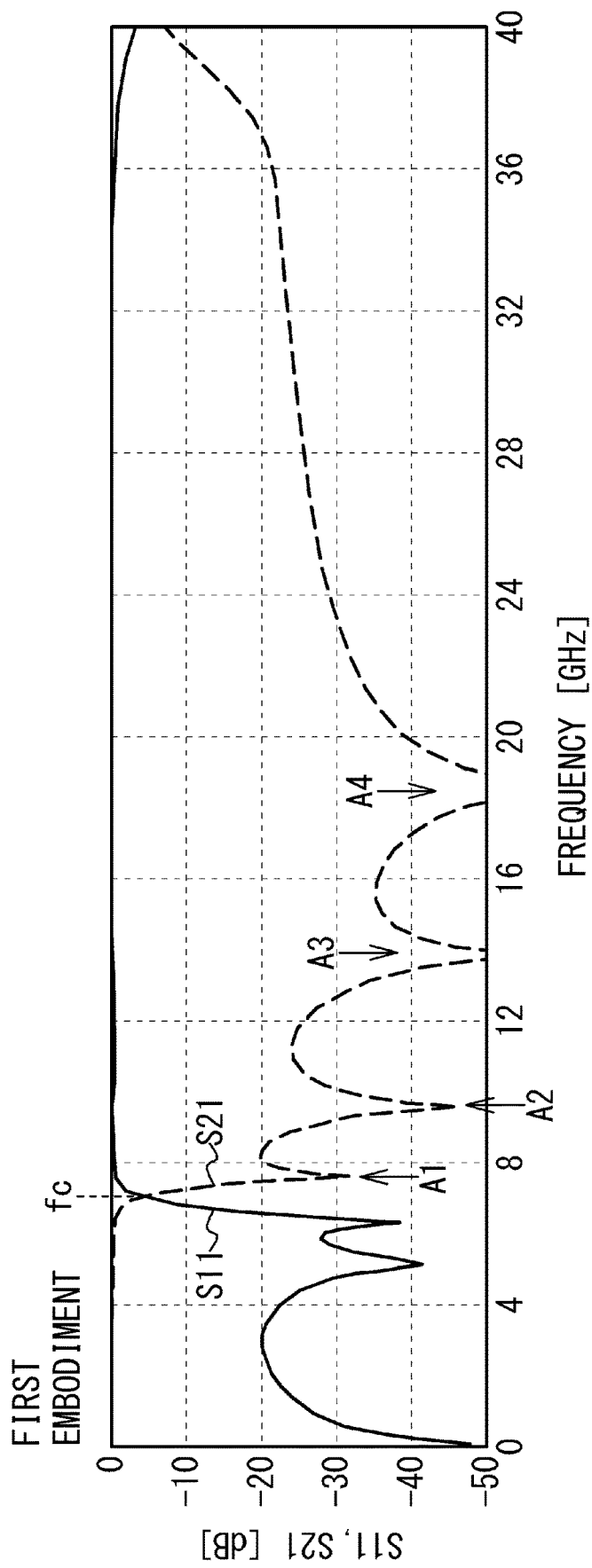
FIG. 6 presents the transmission characteristics and reflection characteristics of the first embodiment in a simulation.
Figure 7:
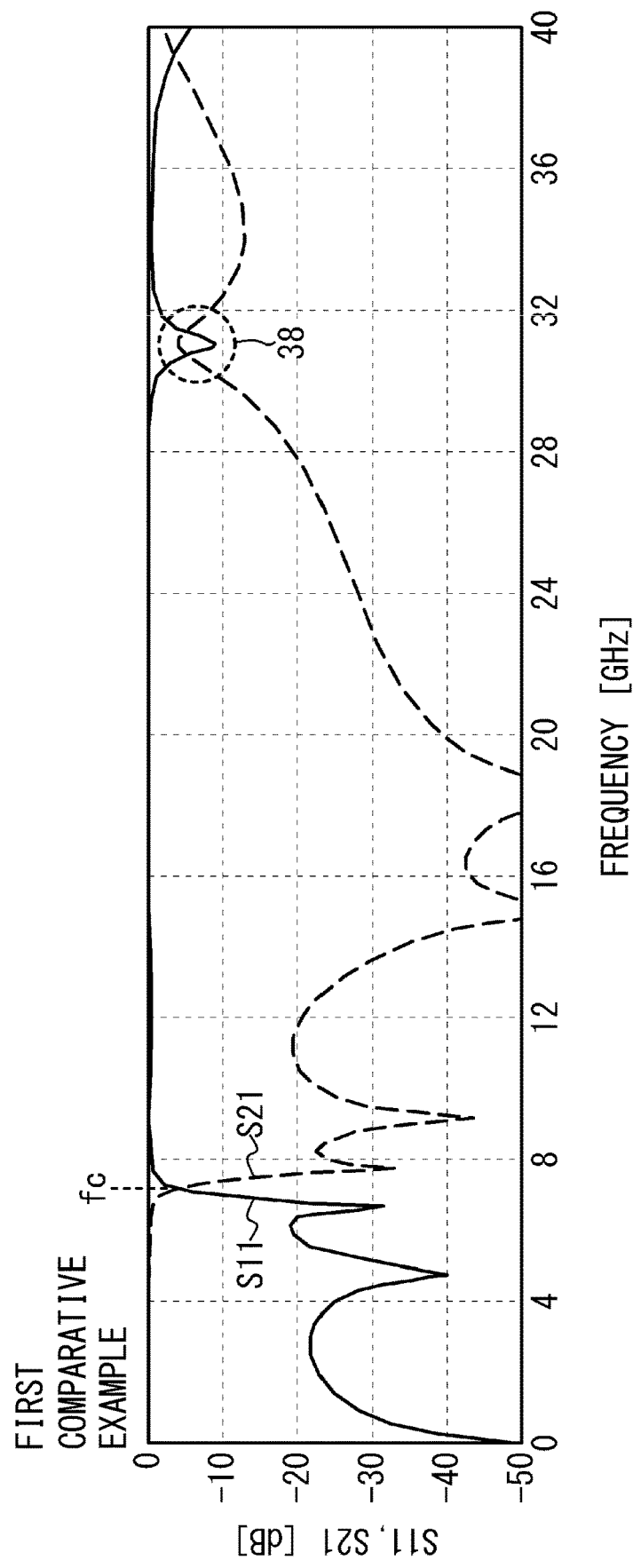
FIG. 7 presents the transmission characteristics and reflection characteristics of the first comparative example in the simulation.
Figure 8:
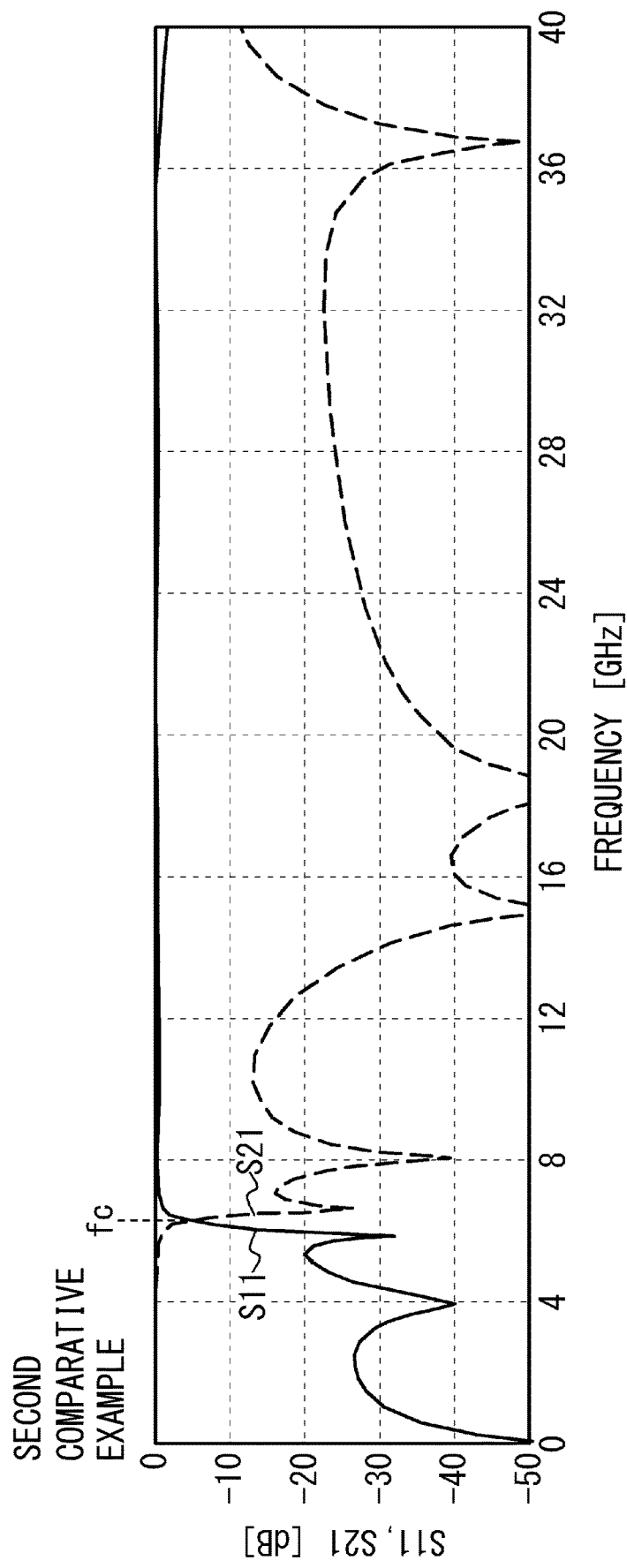
FIG. 8 presents the transmission characteristics and reflection characteristics of the second comparative example in the simulation.

FIG. 6 to FIG. 8 present the transmission characteristics and reflection characteristics of the first embodiment and the first and second comparative example in the simulation, respectively. The absolute value of S21 of the S parameters indicates the transmission characteristics and the absolute value of S11 of the S parameters indicates the reflection characteristics.

As presented in FIG. 6, when the frequency at which S21 is −3 dB is referred to as a cutoff frequency fc (i.e., the high frequency end of the passband), the cutoff frequency fc is approximately 7 GHz. At frequencies lower than the cutoff frequency fc, S21 is approximately 0 dB and S11 is −20 dB or less. At frequencies higher than the cutoff frequency fc, S21 is −20 dB or less, and S11 is approximately 0 dB. The passband is a band equal to or less than the cutoff frequency fc, and the attenuation band is from the cutoff frequency fc to about 40 GHz.

Attenuation poles A1 to A4 in the attenuation band are mainly formed by the parallel resonant circuits R1 to R4. Good attenuation characteristics are obtained around 30 GHz.

As presented in FIG. 7, in the first comparative example, the cutoff frequency fc is about 7 GHZ, which is the same as in the first embodiment. As indicated by a broken-line circle 38, a spurious emission in which S11 becomes smaller and S21 becomes larger is observed around 31 GHz. Thus, the attenuation characteristics are deteriorated around 30 GHz.

As presented in FIG. 8, in the second comparative example, the spurious emission around 31 GHz observed in the first comparative example is not observed. The cutoff frequency fc is about 7 GHz as in the first embodiment. Good attenuation characteristics are obtained around 30 GHz. As described above, in the first comparative example in which the planar shape of the conductor pattern M1 is a U shape, a spurious emission is generated around 31 GHz. The spurious emission is considered to be related to the planar shape of the conductor pattern M1.

Figure 9A:
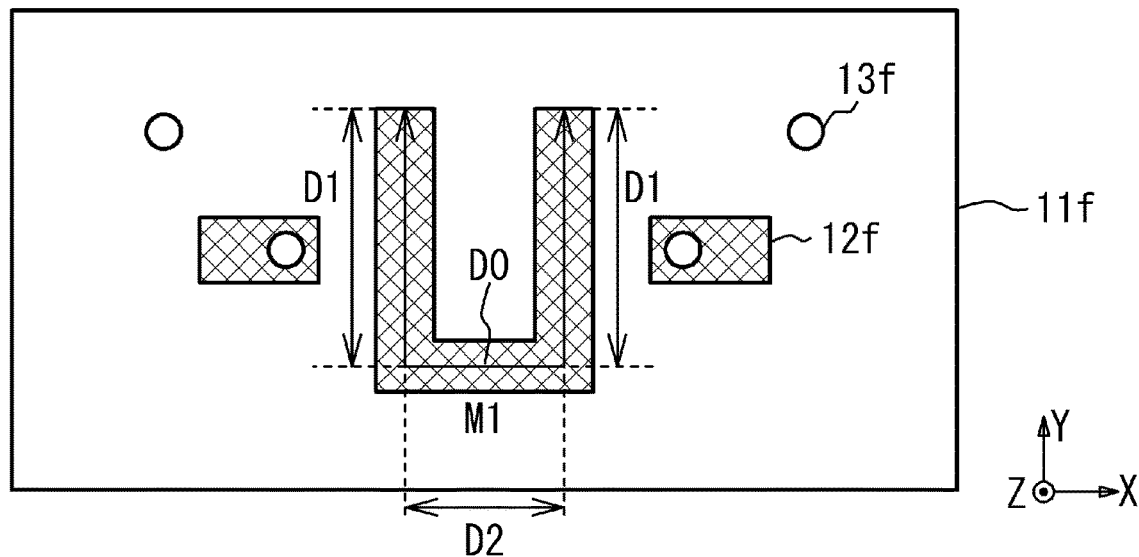
FIG. 9A and FIG. 9B are plan views of the dielectric layer 11f in the first comparative example and the first embodiment, respectively.
Figure 9B:
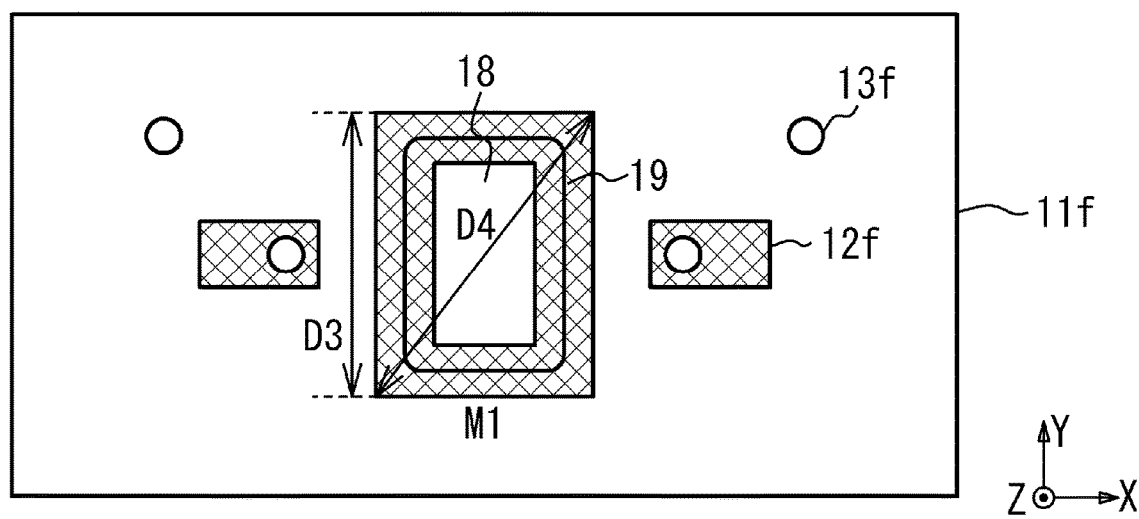

In the first comparative example, the cause of the occurrence of the spurious emission around 31 GHz will be considered. FIG. 9A and FIG. 9B are plan views of the dielectric layer 11f in the first comparative example and the first embodiment, respectively. As illustrated in FIG. 9A, in the first comparative example, the conductor pattern M1 is U-shaped. Therefore, the conductor pattern M1 becomes a line having a length D0. The length D0 is the length of the center line of the conductor pattern M1. The length D0 is expressed by D0=D1+D2+D1. Here, D1=375 μm, D2=275 μm, and D0=1025 μm. When the length D0 is ¼ of the wave length λ of the high-frequency signal, the conductor pattern M1 causes resonance. Therefore, the frequency at which the length D0 is λ/4 is calculated. When the relative permittivity of the multilayer body 10 is εr, the wavelength λ at which D0=λ/4 is $\lambda=4 \times D0 \times \sqrt{\varepsilon r}=4 \times 1.025 \times 10^{-3}$ m×$\sqrt{10}\approx 1.3 \times 10^{-2}$ m=13 mm. When the speed of light cis c≈3×10⁸ m/s, the frequency fs at which the wavelength is Δ is fs=c/λ≈23 GHz. As described above, the frequency at which the conductor pattern M1 resonates when the length of the conductor pattern M1 is λ/4 has a numerical value close to 31 GHz at which the spurious emission occurs in the first comparative example.

As presented illustrated in FIG. 9B, in the first embodiment, the conductor pattern M1 has the opening 18 and is a closed pattern in which a current path 19 is closed. Therefore, a long line as in the first comparative example in FIG. 9A is not formed. The length D3 of the long side of the conductor pattern M1 is 475 μm. The wavelength λ at which D3=λ/4 is $\lambda=4 \times D3 \times \sqrt{\varepsilon r}=4 \times 0.475 \times 10^{-3} \times \sqrt{10}\approx 6 \times 10^{-3}$ m=6 mm, and the frequency fs is fs=c/λ ~ 50 GHz. Therefore, the frequency at which the length of the conductor pattern M1 is λ/4 is 50 GHz. The length D4 of the diagonal line of the conductor pattern M1 is 605 μm. The wavelength λ at which D4=λ/4 is $\lambda=4 \times D4 \times \sqrt{\varepsilon r}=4 \times 0.605 \times 10^{-3} \times \sqrt{10}\approx 7.7 \times 10^{-3}$ m=7.7 mm, and the frequency fs is fs=c/λ≈40 GHz. As described above, the frequency at which the length of the conductor pattern M1 is λ/4 is 40 to 50 GHz.

In the first comparative example, since the frequency at which the conductor pattern M1 resonates when the length of the conductor pattern is λ/4 is around 30 GHz, it is considered that a spurious emission is generated around 30 GHz as illustrated in FIG. 7. On the other hand, in the first embodiment and the second comparative example, since the frequency at which the conductor pattern M1 resonates is equal to or higher than 40 GHz, it is considered that no spurious emission is generated in FIG. 6 and FIG. 8.

Figure 10A:
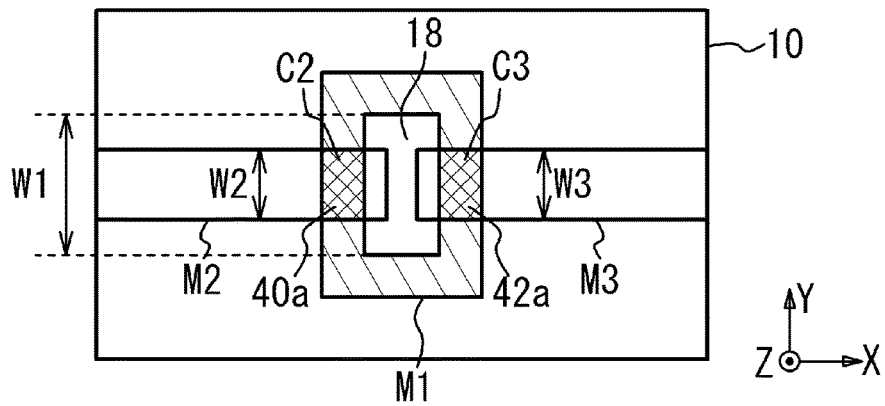
FIG. 10A and FIG. 10B are plan views of conductor patterns M1 to M3 in the first embodiment.
Figure 10B:
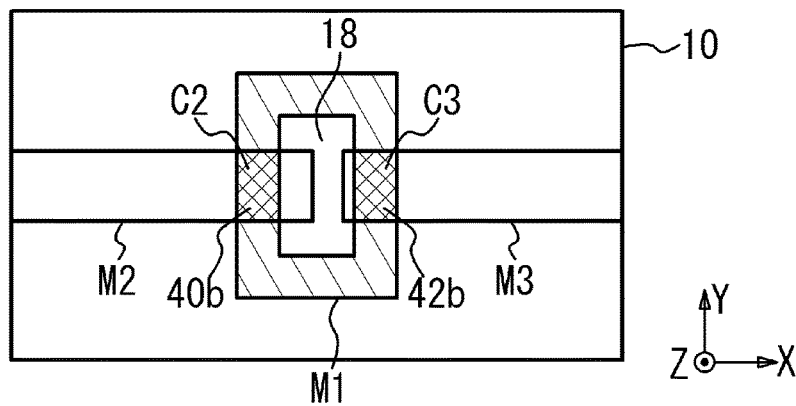
Figure 10C:
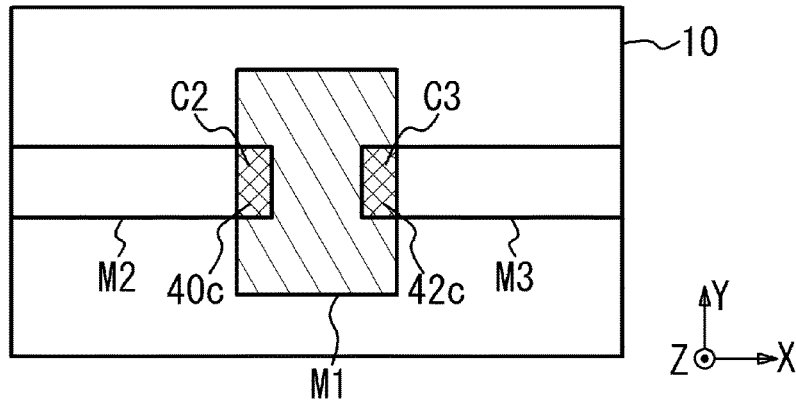
FIG. 10C and FIG. 10D are plan views of the conductor patterns M1 to M3 in the second comparative example.
Figure 10D:
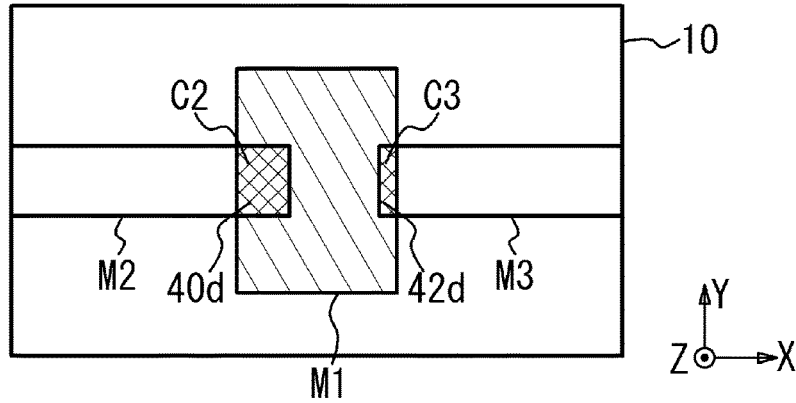

FIG. 10A and FIG. 10B are plan views of the conductor patterns M1 to M3 in the first embodiment, and FIG. 10C and FIG. 10D are plan views of the conductor patterns M1 to M3 in the second comparative example.

As illustrated in FIG. 10A, in the first embodiment, when viewed from the Z direction, the end portion of the conductor pattern M2 is located within the opening 18 of the conductor pattern M1, and the conductor pattern M2 extends from the inside of the opening 18 to the outside of the conductor pattern M1. The end portion of the conductor pattern M3 is located within the opening 18 of the conductor pattern M1, and the conductor pattern M3 extends from the inside of the opening 18 to the outside of the conductor pattern M1. The capacitor C2 is formed in a region 40a where the conductor patterns M1 and M2 overlap each other. The capacitor C3 is formed in a region 42a where the conductor patterns M1 and M3 overlap each other.

As illustrated in FIG. 10B, when the conductor pattern M1 is misaligned with the conductor patterns M2 and M3, for example, when the conductor patterns M2 and M3 are shifted from the conductor pattern M1 in the +X direction, the area of a region 40b where the conductor patterns M1 and M2 overlap each other and the area of a region 42b where the conductor patterns M1 and M2 overlap each other are almost the same as the area of the region 40a and the area of the region 42a in FIG. 10A, respectively. Therefore, even when misalignment occurs between the conductor patterns M2 and M3 and the conductor pattern M1, the capacitances of the capacitors C2 and C3 are almost the same as those in FIG. 10A.

As illustrated in FIG. 10C, in the second comparative example, the conductor pattern M1 is a solid pattern without the opening 18. The capacitor C2 is formed in a region 40c where the conductor patterns M1 and M2 overlap each other. The capacitor C3 is formed in a region 42c where the conductor patterns M1 and M3 overlap each other.

As illustrated in FIG. 10D, for example, when the conductor patterns M2 and M3 are shifted from the conductor pattern M1 in the +X direction, the area of a region 40d where the conductor patterns M1 and M2 overlap becomes larger than the area of the region 40c in FIG. 10C, and the area of a region 42d where the conductor patterns M1 and M3 overlap becomes smaller than the area of the region 42c in FIG. 10C. As a result, the capacitance of the capacitor C2 becomes larger than that in FIG. 10C, and the capacitance of the capacitor C3 becomes smaller than that in FIG. 10C. When a filter is designed using the capacitances of the capacitors C2 and C3 illustrated in FIG. 10C, in FIG. 10D, the capacitances of the capacitors C2 and C3 deviate from the design values.

As described above, in the first embodiment, by providing the conductor patterns M2 and M3 so as to cross the ring-shaped closed pattern of the conductor pattern M1 when viewed from the Z direction, even when misalignment occurs between the conductor pattern M1 and the conductor patterns M2 and M3, it is possible to reduce a change in capacitance of the capacitor C2 and a change in capacitance of the capacitor C3.

First Variation of the First Embodiment

Figure 11A:
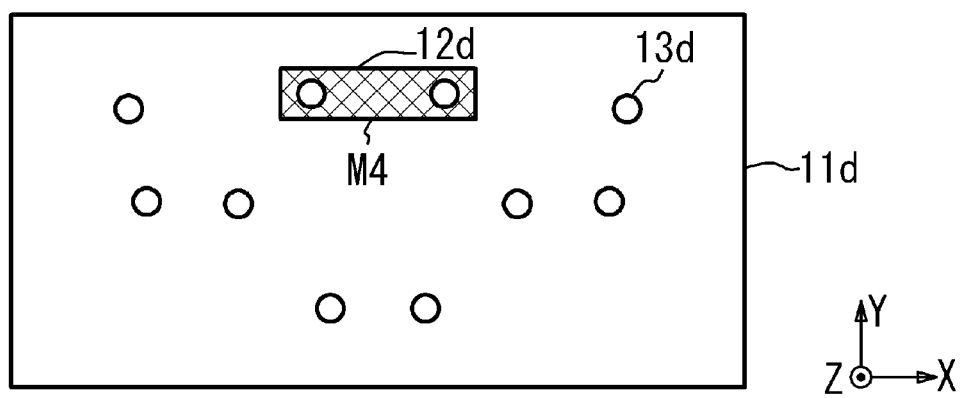
FIG. 11A to FIG. 11C are plan views of the dielectric layers in a first variation of the first embodiment.
Figure 11B:
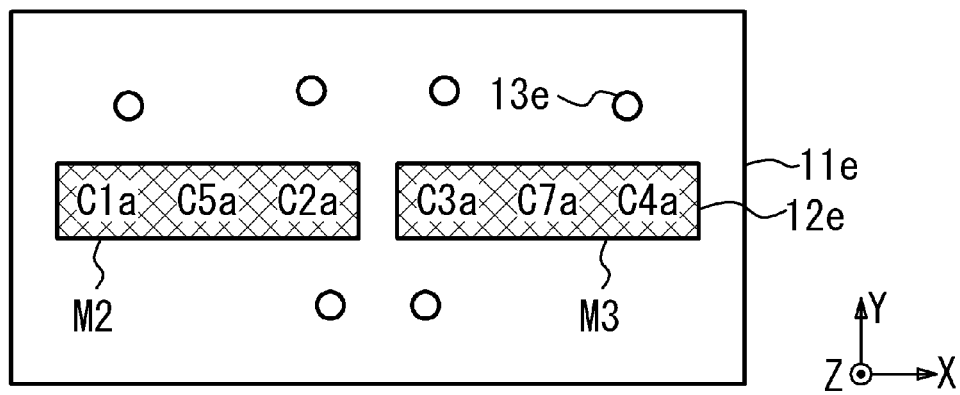
Figure 11C:
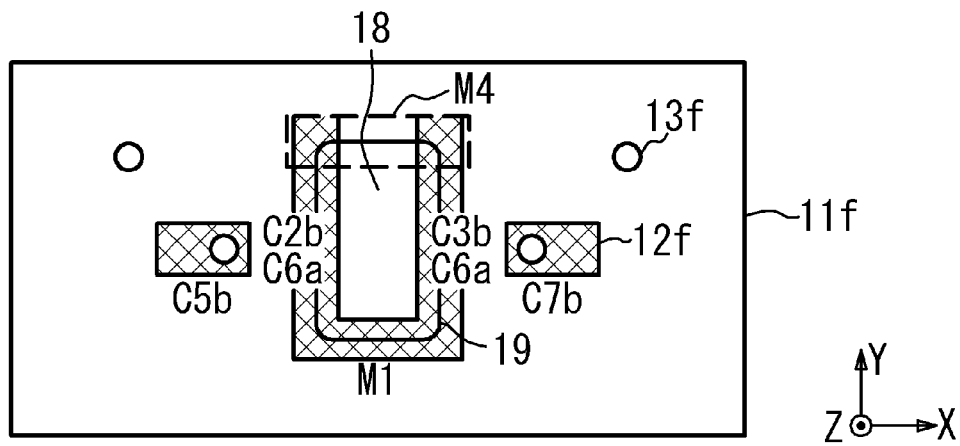

FIG. 11A to FIG. 11C are plan views of dielectric layers in a first variation of the first embodiment. In FIG. 11C, a conductor pattern M4 viewed from the Z direction is indicated by a broken line.

As illustrated in FIG. 11A, the conductor layer 12d forming the conductor pattern M4 is provided on the upper surface of the dielectric layer 11d. As illustrated in FIG. 11B, the dielectric layer 11e is provided with the via wirings 13e connected to the conductor pattern M4, unlike in FIG. 3D. As illustrated in FIG. 11C, the conductor pattern M1 is U-shaped. As illustrated in FIG. 11A and FIG. 11C, the planar shape formed of the combination of the conductor patterns M1 and M4 as viewed from the Z direction is a closed pattern. A first end portion of the conductor pattern M1 and a first end portion of the conductor pattern M4 are electrically connected to each other through the via wirings 13d and 13e, and a second end portion of the conductor pattern M1 and a second end portion of the conductor pattern M4 are electrically connected to each other through the via wirings 13d and 13e. As a result, the closed loop current path 19 is formed in a closed pattern.

As in the first variation of the first embodiment, even when the conductor pattern M1 forming the electrodes C2b and C3b of the capacitors C2 and C3 is U-shaped, it is only necessary to form a closed pattern together with another conductor pattern M4.

In the first embodiment and the variation thereof, in the multilayer body 10, the conductor pattern M1 (a first conductor pattern) whose planar shape when viewed from the Z direction forms at least a part of the closed pattern having the opening 18 is formed of the conductor layer 12f (a first conductor layer). The closed pattern is a pattern in which the path 19 through which a current flows is closed. This configuration increases the frequency at which the conductor pattern M1 resonates when the length thereof is λ/4, and causes spurious emissions to be less likely to occur in the attenuation band.

The conductor pattern M2 (a second conductor pattern) is formed of the conductor layer 12e (a second conductor layer) different from the conductor layer 12f, and is connected to the input terminal Tin. When viewed from the Z direction, at least a part of the conductor pattern M2 overlaps at least a part of the conductor pattern M1 to form the capacitor C2 (a first capacitor). The conductor pattern M3 (a third conductor pattern) is formed of the conductor layer 12e (a third conductor layer) different from the conductor layer 12f and is connected to the output terminal Tout. At least a part of the conductor pattern M3 overlaps at least a part of the conductor pattern M1 to form the capacitor C3 (a second capacitor). When viewed from the Z direction, an end portion of the conductor pattern M2 is located within the opening 18, and the conductor pattern M2 extends from the inside of the opening 18 to the outside of the closed pattern. When viewed from the Z direction, the conductor pattern M3 does not overlap with the conductor pattern M2, and an end portion of the conductor pattern M3 is located within the opening 18, and the conductor pattern M3 extends from the inside of the opening 18 to the outside of the closed pattern. Thus, as illustrated in FIG. 10A and FIG. 10B, even when misalignment occurs between the conductor pattern M1 and the conductor patterns M2 and M3, it is possible to inhibit the capacitances of the capacitors C2 and C3 from deviating from the design values.

As illustrated in FIG. 10A and FIG. 10B, when viewed from the Z direction, the conductor patterns M2 and M3 are provided so as to face each other across the opening 18. Thus, even when misalignment occurs between the conductor pattern M1 and the conductor patterns M2 and M3, it is possible to further inhibit the capacitances of the capacitors C2 and C3 from deviating from the design value.

In the first embodiment and the first variation thereof, the planar shape of the closed pattern is a quadrangular shape. However, the planar shape of the closed pattern may be an O-shape such as a circular shape or an elliptical shape. However, when viewed from the Z direction, the planar shapes of the regions 40a and 40b where the conductor patterns M1 and M2 overlap are preferably substantially parallelograms to the extent of manufacturing errors, and the planar shapes of the regions 42a and 42b where the conductor patterns M1 and M3 overlap are preferably substantially parallelograms to the extent of manufacturing errors. This configuration allows the area of the region 40a and the area of the region 40b to be almost the same, and the area of the region 42a and the area of the region 42b to be almost the same even when misalignment occurs between the conductor pattern M1 and the conductor patterns M2 and M3. Therefore, it is possible to further inhibit the capacitances of the capacitors C2 and C3 from deviating from the design values.

The first width W2, along the opening 18, of the region 40a where the conductor pattern M2 overlaps the conductor pattern M1 when viewed from the Z direction is smaller than the width W1, in the width direction of the width W2, of the opening 18. The second width W3, along the opening 18, of the region 42a where the conductor pattern M3 overlaps the conductor pattern M1 when viewed from the Z direction is smaller than the width W1, in the width direction of the width W3, of the opening 18. This configuration allows the area of the region 40a and the area of the region 40b to be almost the same, and the area of the region 42a and the area of the region 42b to be almost the same even when misalignment occurs between the conductor pattern M1 and the conductor patterns M2 and M3. Therefore, it is possible to further inhibit the capacitances of the capacitors C2 and C3 from deviating from the design values. The widths W2 and W3 are preferably equal to or less than 0.9 times the width W1, and more preferably equal to or less than 0.8 times the width W1.

As illustrated in FIG. 1, between the input terminal Tin and the output terminal Tout, the inductor L2 (a first inductor) is connected in parallel to the capacitor C2, and the inductor L3 (a second inductor) is connected in parallel to the capacitor C3. In such a configuration, resonance caused by a λ/4-line becomes a problem. Therefore, it is preferable to form the electrodes C2b and C3b in a closed pattern.

The parallel resonant circuit R2 (a first parallel resonant circuit) including the capacitor C2 and the inductor L2 forms the attenuation pole at a frequency higher than the passband, and the parallel resonant circuit R3 (a second parallel resonant circuit) including the capacitor C3 and the inductor L3 forms the attenuation pole at a frequency higher than the passband. In such a configuration, resonance caused by a λ/4-line becomes a problem. Therefore, it is preferable to form the electrodes C2b and C3b in a closed pattern.

A first end of the capacitor C6 (a third capacitor) is connected to the conductor pattern M1 and a second end thereof is connected to the ground terminal Tg. In such a configuration, resonance caused by a λ/4-line becomes a problem. Therefore, it is preferable to form the electrodes C2b and C3b in a closed pattern.

In the first embodiment and the first variation thereof, only two parallel resonant circuits R2 and R3 of the parallel resonant circuits R1 and R4 may be provided, or three or five or more parallel resonant circuits may be provided. In the filter 100, the input terminal Tin and the output terminal Tout are symmetric, that is, the capacitances of the capacitors are symmetric with respect to the node N2 and the capacitor C6, and the inductances of the inductors are symmetric with respect to the node N2 and the capacitor C6. The input terminal Tin and the output terminal Tout may be asymmetric.

In the 5G communication system, signals of 6 GHz or less and signals of 28 GHz are used. Therefore, when the high frequency end of the passband (i.e., the cutoff frequency fc at which S21 is −3 dB) is 7 GHZ, the frequency of the spurious emission is preferably 28 GHz or higher. Therefore, the frequency of the spurious emission caused by the resonance of the λ/4-line of the closed pattern is preferably equal to or greater than four times the cutoff frequency fc. Therefore, when the maximum width of the closed pattern is X (m), the cutoff frequency is fc (Hz), and the relative permittivity of each of the plurality of the dielectric layers 11a to 11h is εr, the frequency fr of the spurious emission caused by the resonance of the $\lambda/4$-line is $fr=4 \times fc \geq c/(4 \times X \times \sqrt{\varepsilon r})$. Therefore, it is preferable that $X \leq c/(4 \times 4 \times fc \times \sqrt{\varepsilon r})=1.875 \times 10^7/(fc \times \sqrt{\varepsilon r})$ [m]. When the frequency of the spurious emission is equal to or greater than five times the cutoff frequency fc, $X \leq c/(5 \times 4 \times fc \times \sqrt{\varepsilon r})=1.5 \times 10^7/(fc \times \sqrt{\varepsilon r})$ [m] is more preferable. For filters that allow high-frequency signals of 6 GHz or lower used in the 5G communication system to pass therethrough, $X \leq 2.68 \times 10^{-3}/\sqrt{\varepsilon r}$ [m] is preferable, and $X \leq 2.14 \times 10^{-3}/\sqrt{\varepsilon r}$ [m] is more preferable.

As in the first embodiment, the closed pattern may be one conductor pattern M1 formed of the conductor layer 12f provided between the adjacent dielectric layers 11e and 11f.

As in the first variation of the first embodiment, the closed pattern may include the conductor patterns M1 and M4, and the via wirings connecting the end portions of the conductor pattern M1 and the end portions of the conductor pattern M2. The conductor pattern M4 (a fourth conductor pattern) is formed of the conductor layer 12d (a fourth conductor layer) different from the conductor layer 12f. The closed pattern may be formed of three or more different conductor patterns.

The conductor layer 12e in which the conductor pattern M2 is provided and the conductor layer 12e in which the conductor pattern M3 is provided may be different conductor layers or may be the same conductor layer. The conductor layer 12d in which the conductor pattern M4 is provided may be a conductor layer different from or the same as the conductor layer 12e in which the conductor patterns M2 and M3 are provided.

Although the low-pass filter has been described as an example of the filter, the filter may be a band-pass filter.

SECOND EMBODIMENT

Figure 12:
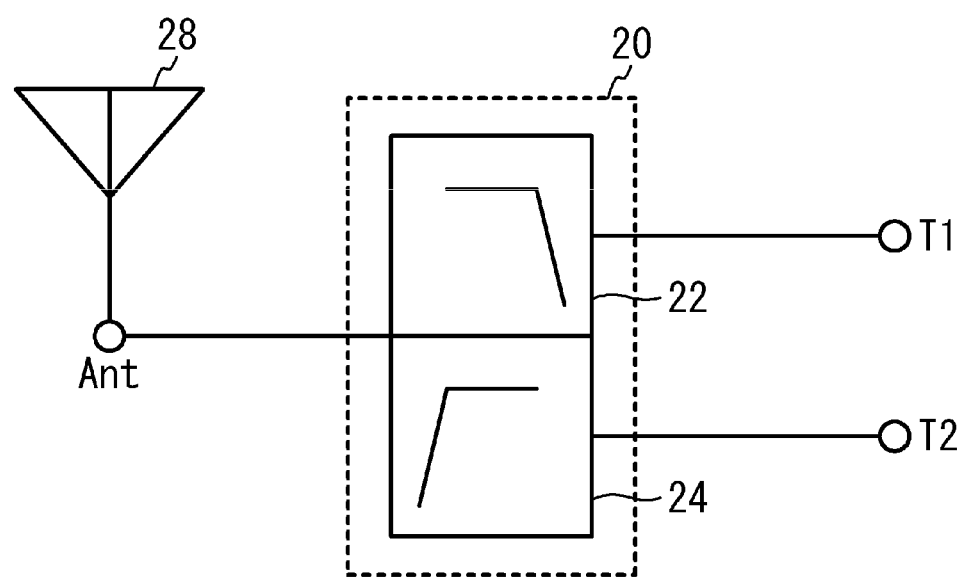
FIG. 12 is a circuit diagram of a diplexer in accordance with a second embodiment.

FIG. 12 is a circuit diagram of a diplexer in accordance with a second embodiment. As illustrated in FIG. 12, a diplexer 20 includes filters 22 and 24. The filter 22 is connected between a common terminal Ant and a terminal T1, and the filter 24 is connected between the common terminal Ant and a terminal T2. An antenna 28 is connected to the common terminal Ant. The filter 22 is, for example, a low-pass filter (LPF), allows a high-frequency signal in a low band to pass therethrough and suppresses signals with other frequencies. The filter 24 is, for example, a high-pass filter HPF, and allows a high-frequency signal in a high band higher than the low band in frequency to pass therethrough, and suppresses signals with other frequencies.

The filter 22 may be the filter in accordance with any one of the first embodiment and the variation thereof. Although the example of the diplexer is described as an example of the multiplexer, the multiplexer may be a triplexer or a quadplexer.

Although the embodiment of the present invention has been described in detail above, the present invention is not limited to the specific embodiment, and various modifications and changes can be made within the scope of the gist of the present invention described in the claims.

What is claimed is:

1. A filter comprising:
    a multilayer body in which a plurality of dielectric layers and a plurality of conductor layers are alternately stacked in a stacking direction;
    an input terminal provided on a surface of the multilayer body;
    an output terminal provided on a surface of the multilayer body;
    a first conductor pattern formed of a first conductor layer of the plurality of conductor layers, the first conductor pattern having a planar shape that forms at least a part of a closed pattern having an opening when viewed from the stacking direction;
    a second conductor pattern formed of a second conductor layer different from the first conductor layer of the plurality of conductor layers, and connected to the input terminal, at least a part of the second conductor pattern overlapping with at least a part of the first conductor pattern when viewed from the stacking direction, an end portion of the second conductor pattern being located within the opening of the closed pattern when viewed from the stacking direction, the second conductor pattern extending from an inside of the opening to an outside of the closed pattern when viewed from the stacking direction; and
    a third conductor pattern formed of a third conductor layer that is same as or different from the second conductor layer and that is different from the first conductor layer of the plurality of conductor layers, and connected to the output terminal, at least a part of the third conductor pattern overlapping with at least a part of the first conductor pattern when viewed from the stacking direction, the third conductor pattern not overlapping with the second conductor pattern when viewed from the stacking direction, an end portion of the third conductor pattern being located within the opening of the closed pattern when viewed from the stacking direction, the third conductor pattern extending from the inside of the opening to the outside of the closed pattern when viewed from the stacking direction,
    wherein a first width, along the opening, of a region where the second conductor pattern overlaps the first conductor pattern when viewed from the stacking direction is smaller than a width, in a width direction of the first width, of the opening, and
    wherein a second width, along the opening, of a region where the third conductor pattern overlaps the first conductor pattern when viewed from the stacking direction is smaller than a width, in a width direction of the second width, of the opening.

2. The filter according to claim 1, wherein the closed pattern is a pattern in which a path through which a current flows is closed.

3. The filter according to claim 1, wherein the second conductor pattern and the third conductor pattern are provided so as to face each other across the opening when viewed from the stacking direction.

4. The filter according to claim 1, wherein a planar shape of a region where the first conductor pattern and the second conductor pattern overlap each other is a substantially parallelogram when viewed from the stacking direction, and a planar shape of a region where the first conductor pattern and the third conductor pattern overlap each other is a substantially parallelogram when viewed from the stacking direction.

5. The filter according to claim 1,
    wherein the first conductor pattern and the second conductor pattern form a first capacitor, and
    wherein the first conductor pattern and the third conductor pattern form a second capacitor.

6. The filter according to claim 5, further comprising:
    a first inductor connected in parallel to the first capacitor between the input terminal and the output terminal; and a second inductor connected in parallel to the second capacitor between the input terminal and the output terminal.

7. The filter according to claim 6,
wherein a first parallel resonant circuit including the first capacitor and the first inductor forms an attenuation pole at a frequency higher than a passband, and
wherein a second parallel resonant circuit including the second capacitor and the second inductor forms an attenuation pole at a frequency higher than the passband.

8. The filter according to claim 5, further comprising:
a ground terminal provided on a surface of the multilayer body; and
a third capacitor having a first end connected to the first conductor pattern and a second end connected to the ground terminal.

9. A multiplexer comprising:
the filter according to claim 1.

10. The filter according to claim 1, wherein $X \leq 1.875 \times 10^7/(fc \times \sqrt{\varepsilon r})$ is satisfied, where X (m) is a maximum width of the closed pattern, fc (Hz) is a high frequency end of a passband, and $\varepsilon r$ is a relative permittivity of each of the plurality of dielectric layers.

11. The filter according to claim 1, wherein the filter is a low-pass filter or a band-pass filter.

12. A filter comprising:
a multilayer body in which a plurality of dielectric layers and a plurality of conductor layers are alternately stacked in a stacking direction;
an input terminal provided on a surface of the multilayer body;
an output terminal provided on a surface of the multilayer body;
a first conductor pattern formed of a first conductor layer of the plurality of conductor layers, the first conductor pattern having a planar shape that forms a notch pattern surrounding a recess when viewed from the stacking direction;
a second conductor pattern formed of a second conductor layer different from the first conductor layer of the plurality of conductor layers, and connected to the input terminal, at least a part of the second conductor pattern overlapping with at least a part of the first conductor pattern when viewed from the stacking direction, an end portion of the second conductor pattern being located within the recess when viewed from the stacking direction, the second conductor pattern extending from an inside of the recess to an outside of the notch pattern when viewed from the stacking direction;
a third conductor pattern formed of a third conductor layer that is same as or different from the second conductor layer and that is different from the first conductor layer of the plurality of conductor layers, and connected to the output terminal, at least a part of the third conductor pattern overlapping with at least a part of the first conductor pattern when viewed from the stacking direction, the third conductor pattern not overlapping with the second conductor pattern when viewed from the stacking direction, an end portion of the third conductor pattern being located within the recess when viewed from the stacking direction, the third conductor pattern extending from the inside of the recess to the outside of the notch pattern when viewed from the stacking direction;
a fourth conductor pattern formed of a fourth conductor layer different from the first conductor layer of the plurality of conductor layers; and
a via wiring that penetrates through one or more dielectric layers of the plurality of dielectric layers and connects the first conductor pattern and the fourth conductor pattern,
wherein the first conductor pattern, the fourth conductor pattern, and the via wiring form a closed pattern which surrounds an opening when viewed from the stacking direction.

* * * * *